United States Patent [19]

Sonntag

[11] Patent Number: 5,012,142
[45] Date of Patent: Apr. 30, 1991

[54] DIFFERENTIAL CONTROLLED DELAY ELEMENTS AND SKEW CORRECTING DETECTOR FOR DELAY-LOCKED LOOPS AND THE LIKE

[75] Inventor: Jeffrey L. Sonntag, Muhlenberg Twp., Berks County, Pa.

[73] Assignee: AT&T Bell Laboratories, Murray Hill, N.J.

[21] Appl. No.: 387,458

[22] Filed: Jul. 28, 1989

[51] Int. Cl.$^5$ .............................................. H03K 5/13
[52] U.S. Cl. ..................................... 307/602; 307/605
[58] Field of Search ............... 307/279, 602, 603, 605, 307/606

[56] References Cited

U.S. PATENT DOCUMENTS

| | | | |
|---|---|---|---|
| 4,476,401 | 10/1984 | Lin | 307/605 |
| 4,496,861 | 1/1985 | Bazes | 307/605 |
| 4,806,804 | 2/1989 | O'Leary | 307/605 |

OTHER PUBLICATIONS

"Design of PLL-Based Clock Generation Circuits", *IEEE Journal of Solid-State Circuits*, vol. SC-22, No. 2, Apr., 1987, pp. 255 through 261.

"Digitally Controlled Oscillator", *IEEE Journal of Solid-State Circuits*, vol. 24, No. 6, Jun. 1989, pp. 640 through 645.

Primary Examiner—John Zazworsky
Attorney, Agent, or Firm—Scott W. McLellan

[57] ABSTRACT

A fully differential variable delay element for providing precision delays for use in digital phase-locked loops or the like. The delay in each stage is controlled by changing bias currents and the coupling of a capacitance load thereto, therby reducing the sensitivity of the delay element to electrical noise at low bias current levels (long delay times). Included is a circuit which substantially removes any skew in the differentially delayed signals from the delay element.

12 Claims, 6 Drawing Sheets

DIFFERENTIAL CONTROLLED DELAY ELEMENTS AND SKEW CORRECTING DETECTOR FOR DELAY-LOCKED LOOPS AND THE LIKE

CROSS-REFERENCE TO RELATED APPLICATION

This application is related to a co-pending patent application titled "Digital Phase-locked Loop for Burst Mode Data Recovery", by R. H. Leonowich, et al., Ser. No. 07/387205, filed simultaneously with, and assigned to the same assignee as, this application.

BACKGROUND OF THE INVENTION

1. Field of the Invention

This invention relates to delay-locked loops in general, and more particularly, to delay-locked loops utilizing digital differential controlled delay elements and pulse skew correcting detectors.

2. Description of the Prior Art

Traditional phase-locked loop (PLL) design involves using a voltage-controlled oscillator (VCO) to provide a local signal which is phase-locked onto an input signal. Implementing the VCO in an integrated circuit, as known in the prior art, typically uses a frequency determining network external to the IC to establish the nominal operating frequency of the VCO. Exemplary frequency determining networks are a resistor-capacitor or an inductor-capacitor combination. Although external frequency determining networks are advantageous for general purpose PLL designs, it is desirable to have fully integrated PLL designs, such as in microprocessors and data communications applications where space and cost are primary concerns. In microprocessor applications, many clock phases are needed which are precisely spaced from one another and are precisely "slaved" to the system clock.

One approach to providing a fully integrated PLL design is disclosed in "Design of PLL-Based Clock Generation Circuits" by D-K Jeong, et al., *IEEE Journal of Solid-State Circuits*, Vol. SC-22, Apr. 1987, pp. 255–261. In particular, the VCO portion is implemented using a ring oscillator (FIG. 4, p. 257), the frequency thereof being determined by varying the delay provided by multiple series-connected delay cells (or elements) making up the ring oscillator. In FIG. 3(c), the basic delay cell is shown having an inverter, consisting of two transistors with common drain terminals and common gate terminals, powered by two current sources, formed by the remaining transistors, with the output of the inverter buffered by a Schmitt trigger and a buffer. The delay provided by the delay cell is substantially determined by the current supplied to the inverter by the current sources.

The main drawback of this technique is the variation of the characteristics of the inverter and current sources caused by processing variations in the manufacture of the IC. When the processing is "fast", for a given desired delay to provide the desired oscillation frequency (or when long delays are desired regardless of the processing variations), the current level supplied to the inverter must be severely restricted. At these lower currents, the output signal is restricted in amplitude, and the inverter generates large amounts of thermal noise and is susceptible to power supply noise. The combination of these problems causes unreliable delay times which, in turn, cause the VCO based on these delay elements to have unstable, uncontrollable characteristics.

SUMMARY OF THE INVENTION

It is, therefore one aspect of this invention to provide a variable delay cell or element having a wide adjustable delay range with low noise generation at long delays. It is a further aspect of the invention to provide the above advantages with minimal susceptibility to power supply noise.

These and other aspects of the invention are satisfied generally by a variable delay element formed in an integrated circuit, and a method for generating such variable delays, in which the delay varies in response to a control signal, characterized by: a first capacitive means; a first variable coupling means, having an output coupling to the output of the delay element, for variably coupling the output of the variable delay element to the first capacitive means; wherein delay of the variable delay element is dependent on the control signal and the amount of coupling by the variable coupling means, such that the amount of coupling varies proportionally with the desired delay of the delay element.

Another aspect of the invention is to provide a corrector for substantially removing any skew in a differential signal, such as that provided in the above summarized delay cell or element. This corrector is characterized by: a flip-flop stage having first and second power terminals and having set and reset inputs; a driver stage having first and second power terminals and having outputs coupling to the set and reset inputs of the flip-flop stage; a first pair of resistors coupled between corresponding first and second power sources and corresponding first and second power terminals of the flip-flop stage; and, a second pair of resistors coupled between the corresponding first and second power sources and corresponding first and second power terminals of the driver stage; wherein the resistances of the resistors of each pair are substantially the same.

BRIEF DESCRIPTION OF THE DRAWING

The foregoing features of this invention, as well as the invention itself, may be more fully understood from the following detailed description of the drawings, in which.

DETAILED DESCRIPTION

Although the circuits described herein are shown implemented in complementary metal-oxide-semiconductor (CMOS) technology, the techniques disclosed herein may be applied to any technology. Further, to characterize the instant invention over the prior art, the term "delay cells" refers to the prior art while "delay elements" refers to the present invention.

Figure 1:
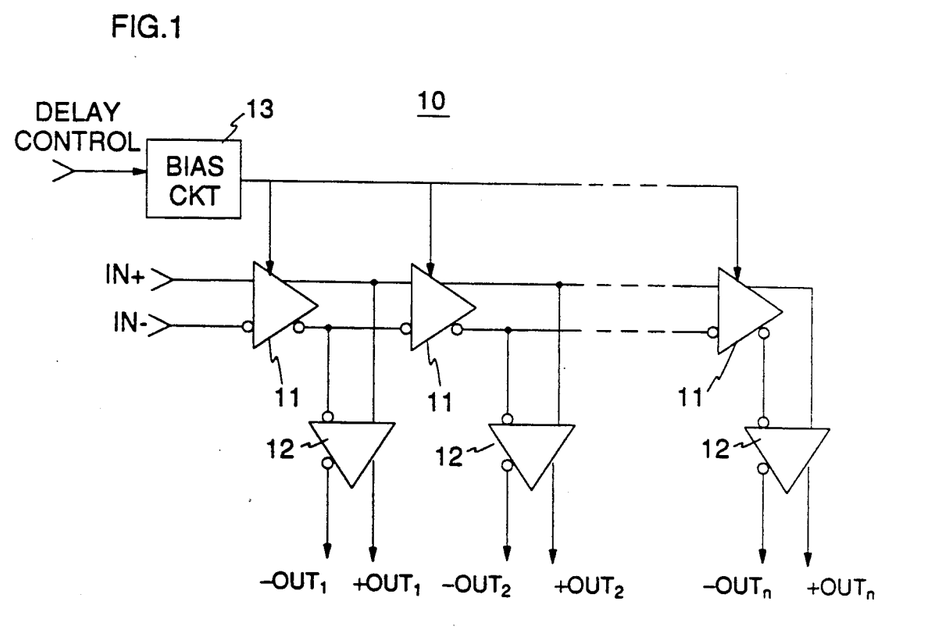
FIG. 1 is a diagram of multiple variable delay elements forming a delay line with multiple taps having skew correctors coupling to each tap.
Figure 5:
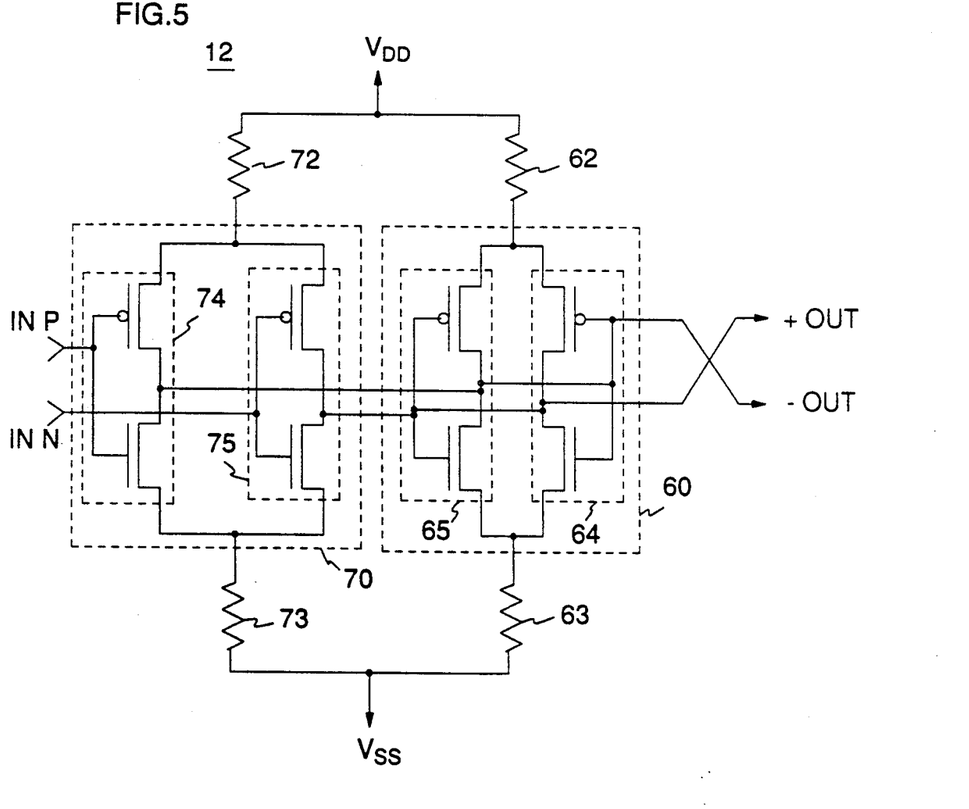

In FIG. 1, a differential tapped delay line 10 having n taps (n=1,2 . . . ) is shown having multiple (n) differential variable delay elements 11, serially coupled. Between each variable delay element 11, skew correcting detectors 12, as will be described in more detail in connection with FIG. 5, provide substantially skew-free differential signals as taps from the delay line 10. Skew is the undesired overlapping of each half of the differential signal which, preferably, is complementary. The effect of skew is to create uncertainty in timing signals derived from the differential signals, which can cause systems relying on the timing signals, such as microprocessors, to fail.

The delay line 10 may be adapted to operate as a voltage controlled variable frequency ring oscillator by feeding back to the inputs IN+, IN−, preferably, a selected output pair of the taps (+OUT$_1$, −OUT$_1$, +OUT$_n$, −OUT$_n$) of correctors 12 with the proper phase to insure oscillation at the desired frequency.

Figure 3:
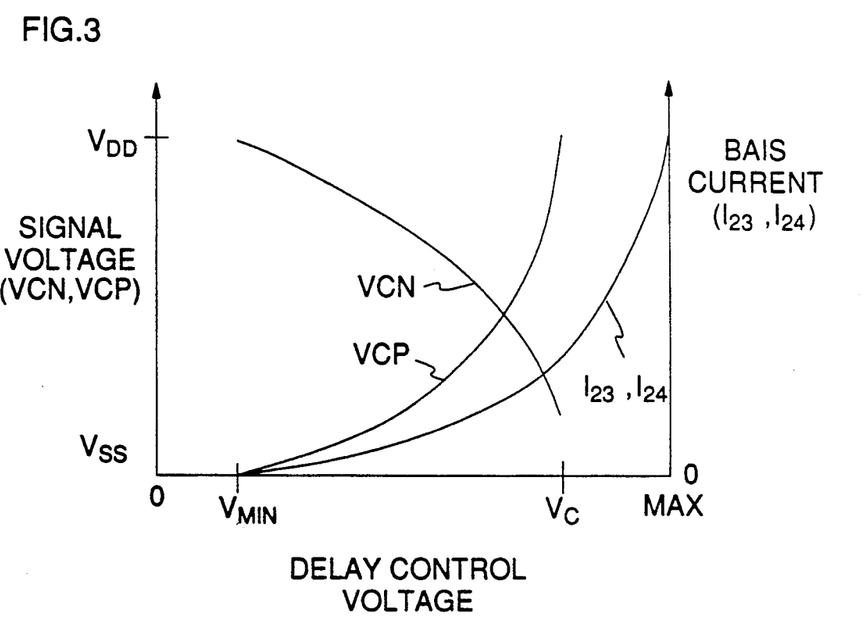
FIG. 3 is an exemplary plot (not to scale) of control signals from the bias circuit of FIG. 1 to the delay elements 11 of FIG. 2 showing the relationships thereof; and, FIG. 4 is a schematic diagram of an exemplary bias circuit of FIG. 1; and, FIG. 5 is a schematic diagram of the low power skew corrector of FIG. 1 according to another aspect of the invention and, FIG. 6 is a schematic diagram of another embodiment of a typical variable delay element of FIG. 1, similar to that shown in FIG. 2.
Figure 4:
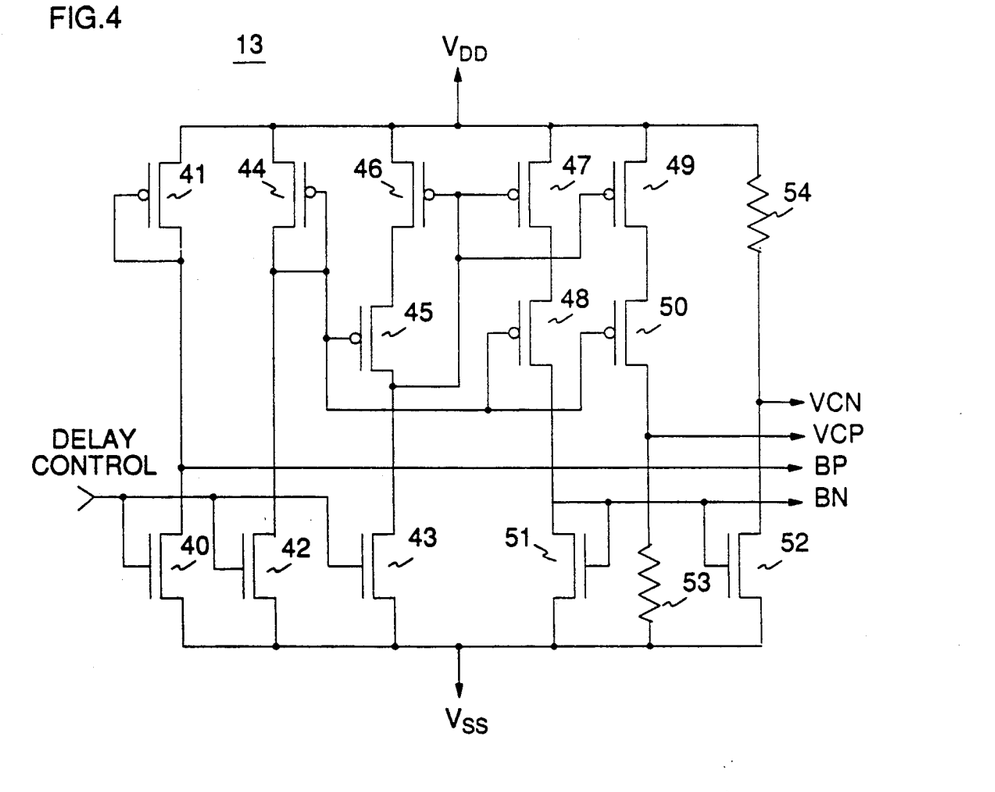

The delay provided by each of the variable delay elements 11 is controlled by bias circuit 13 in response to a delay control signal. The bias circuit 13, which will be described in more detail in connection with FIGS. 3 and 4, provides the proper voltages to the delay elements 11 to control the current supplied to, and the amount of capacitive load coupled to, each delay element 11.

Figure 2:
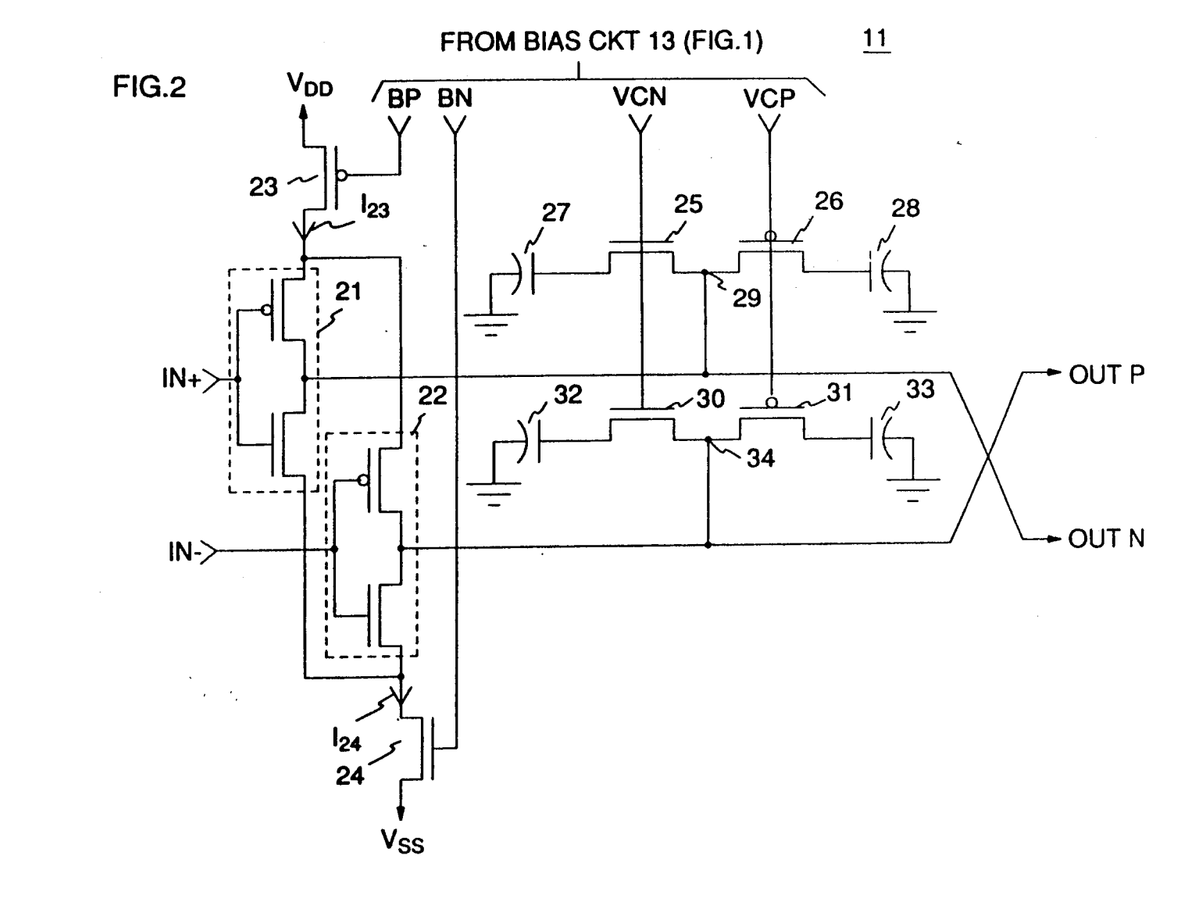
FIG. 2 is a schematic diagram of a typical variable delay element of FIG. 1 according to one aspect of the invention.

In FIG. 2, a variable delay element is shown. The structure of the delay element 11 can be described as a single-ended delay element having an exemplary inverter 21 powered by transistors 23, 24 acting as controlled current sources. Thus, the input to the delay element would be IN+ and the output OUTN. A first capacitive means is shown here as capacitors 27 and 28 while transistors 25, 26 form a first variable coupling means having an output 29 coupling to the delay element 11 output OUTN. Control signals VCN and VCP control the amount of coupling between capacitors 27, 28 and the output of the delay element 11, OUTN by controlling the conductance of transistor 25, 26. To make the delay element 11 differential, inverter 22 is added, along with a second capacitive means 32, 33, and a second variable coupling means of transistors 30, 31 with an output 34 coupling to the remaining output of the delay element 11, OUTP.

Accordingly, as shown in FIG. 2, the variable delay element 11 is now described in a preferred embodiment of the invention. Two inverters 21, 22, responsive to differential input signals IN+, IN−, are commonly powered from transistors 23 and 24 which are, in turn, coupled to power sources V$_{DD}$ and V$_{SS}$, respectively. Transistors 23, 24 vary the amount of current I$_{23}$, I$_{24}$ to the inverters 21, 22 such that the speed of the inverters is proportional to the current supplied; i.e., the more the current supplied to the inverters 23, 24, the smaller the delay. The currents I$_{23}$, I$_{24}$ have, for purposes here, substantially the same magnitude. Control thereof will be discussed in more detail below in connection with FIG. 5, but for purposes here, the signals BP, BN controlling transistors 23, 24 and, hence, the amount of current I$_{23}$, I$_{24}$, respectively, are generated and controlled by the bias circuit 13 (FIG. 1).

Figure 6:
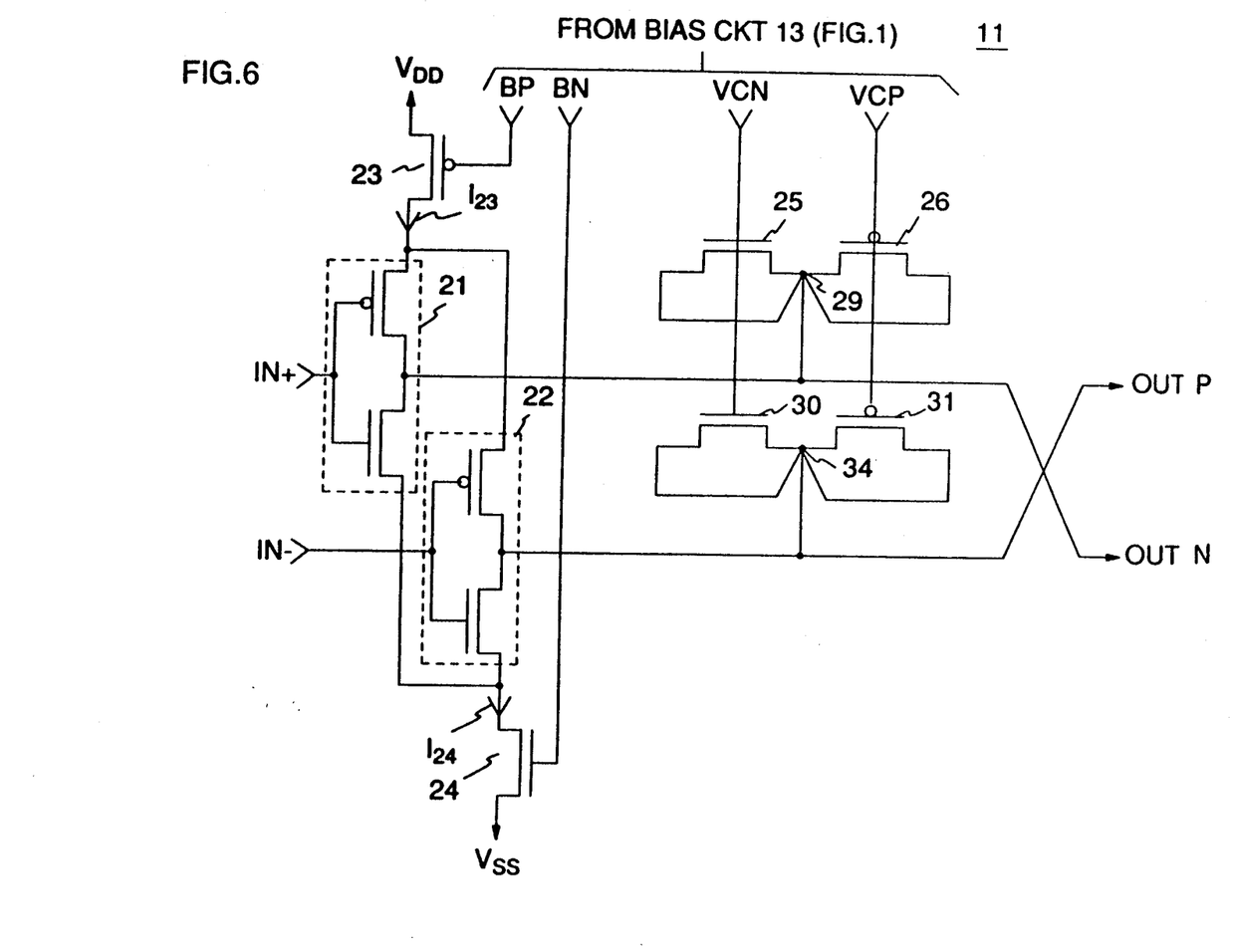

To improve the performance of the delay element 11 at low supply currents (long delays), a capacitive load with variable coupling is provided on the output of each of the inverters 21, 22. The variable coupling of a substantially fixed capacitive load has been found to be as effective as a variable capacitance load, while being easier to integrate onto a common chip. Transistors 25, 26 and capacitors 27, 28 form the capacitive load for inverter 21 through output node 29. Similarly transistors 30, 31 and capacitors 32, 33 form the load for inverter 22 through output node 34. It is understood that instead of transistors 25, 26 and 30, 31 coupling to capacitors 27, 28, and 32, 33, the corresponding source and drain (outputs) thereof may be tied together at corresponding nodes 29, 34 to utilize parasitic capacitances (not shown) as the capacitive load as shown in FIG. 6. The parasitic capacitance arises chiefly between a channel (not shown) formed between the drain and source terminals of transistors 25, 26 and 30, 31 and the IC substrate (not shown). Returning to FIG. 1 (and similarly with FIG. 6), as shown, transistors 25 and 30 are N-channel devices while transistors 26 and 31 are P-channel devices. Using opposite polarity devices improves the loading function on the inverters 21, 22 with large signal voltage swings (near V$_{DD}$ to near V$_{SS}$) by making the loading nearly symmetrical. The N-channel transistors 25, 30 are controlled by signal VCN and the P-channel transistors 26, 31 are controlled by signal VCP. The signals VCN and VCP are generated by the bias circuit 13 (FIG. 1) and will be discussed below.

In FIG. 3, an exemplary relationship (not to scale) between the signals VCN, VCP and the current through the inverters 21, 22, I$_{23}$, I$_{24}$ (FIG. 2), in response to signals BN, BP is plotted against the delay control signal (FIG. 1). As shown, as the delay control voltage is increased, the delay of the delay element 11 (FIG. 2) decreases since the currents I$_{23}$, I$_{24}$ (FIG. 2) increase.

At the minimum control voltage V$_{min}$, the voltages VCN and VCP are at V$_{DD}$ and V$_{SS}$, respectively, allowing maximum coupling (transistors 25, 26, 30, 31 having a high conductivity) of the capacitors 27, 28, 32, 33 to the output of the inverters 21, 22. Further, the currents I$_{23}$, I$_{24}$ are at a minimum, resulting in the maximum delay from the delay element 11 (FIG. 2). As the control voltage is increased, the currents I$_{23}$, I$_{24}$ increase and the voltage VCN decreases while the voltage VCP increases, decreasing the conductivity of transistors 25, 26, 30, 31. This reduces the coupling of the capacitors 27, 28, and 32, 33 to the inverters 21, 22. Once the control voltage exceeds a predetermined voltage, V$_c$, the transistors 25, 26, and 30, 31 are cut off, decoupling the capacitors 27, 28, and 32, 33 from the inverters 21, 22. Hence, with the control voltage greater than V$_c$, delays by the delay element 11 are shorter and are determined primarily by currents I$_{23}$, I$_{24}$.

In FIG. 4, an exemplary bias circuit 13 is diagramed which implements the control signal relationships diagramed in FIG. 3. The delay control signal drives transistors 40 which, in turn, drives diode-connected transistor 41 to provide the control signal BP to the transistor 23 of FIG. 2. Preferably, the sizes of the transistors 41 and 23 are substantially the same. The delay control signal also drives transistors 42 and 43 which, in turn, drive a compound current mirror of transistors 44–50 to provide two substantially equal current outputs from transistors 48 and 50. One of the two current outputs, from transistor 48, drives a current mirror of transistors 51, 52 and provides the control signal BN to transistor 24 of FIG. 2. Preferably, the sizes of the transistors 51, 52, and 24 are substantially the same. The remaining output, from transistor 50, drives resistor 53 to generate the control voltage VCP for the transistors 26 and 31 of FIG. 2. The mirrored current from the transistor 52 drives resistor 54 to generate the control signal VCN for the transistors 25 and 30 of FIG. 2. The resistances of the resistors 53 and 54 should be substantially the same.

It is understood that other implementations of the bias circuit 13 can be used as well as changes to the above-described exemplary circuit may be made without changing the desired characteristics of the control signals BN, BP, VCN, and VCP.

It is understood that the embodiment shown and described above may be implemented in a non-differential form, i.e., in a single-ended form. However, the inherent noise immunity of the differential form is then lost.

Returning to FIG. 1, skew correctors 12 substantially remove skew in the differential signals from each of the delay elements 11. In particular, as the delay from the delay elements 11 increases, the amount of skew between signals on OUTN and OUTP may increase. In FIG. 5, a low power skew corrector is shown. A flip-flop stage 60 is driven by driver stage 70. Flip stop stage 60 substantially removes skew by forcing the outputs therefrom (+OUT, −OUT) to be complementary at substantially all times. The driver stage 70 overcomes the cross-coupling in the flip-flop stage 60 to change the state thereof. The flip-flop stage 60 is powered by two resistors 62, 63 in series with power sources $V_{DD}$ and $V_{SS}$. Similarly, the driver stage 70 is powered by two resistors 72, 73 in series with the power sources $V_{DD}$ and $V_{SS}$. The resistances of resistors 62, 63 and 72, 73 will be discussed in more detail below, but it is sufficient to state here that the resistances of resistors 62 and 63 are substantially the same. Similarly, the resistances of resistors 72 and 73, are substantially the same. Further, the resistance of resistors 62 and 63 is substantially equal to or greater than that of resistors 72 and 73 depending on the amount of hysteresis desired. Hysteresis is, for purposes here, the difference in differential input signal voltage to the driver stage 70 which causes the flip-flop stage 60 to change state. For example, the greater the ratio, the smaller the hysteresis. However, the larger the ratio, the smaller the reduction in skew. Resistors 62, 63, and 72, 73 reduce the power consumption of the skew corrector 12 by limiting the amount of current consumed by the flip-flop stage 60 and the driver stage 70 when the flip-flop stage 60 is changing state.

The flip-flop stage 60 has two cross-coupled inverters 64, 65. Similarly, driver stage 70 has two inverters 74, 75, driving the corresponding input of inverters 64, 65 of the flip-flop stage 60. As stated above, the inverters 64, 65 of the flip-flop stage 60 are commonly powered via resistors 62, 63. Similarly, the inverters 74, 75 of the driver stage 70 are commonly powered via the resistors 72, 73. It is understood that to have the driver stage 70 control the flip-flop 60, the current sourcing and sinking capability of the inverters 74, 75 must be substantially equal to or greater than that of inverters 64, 65. This increased current handling capability is provided by making the resistances of resistors 72, 73 substantially equal to or less than the resistances of resistors 62, 63, discussed above, and the sizes of the transistors (not numbered) in the inverters 74, 75 are substantially equal to or larger than the corresponding transistors (not numbered) in inverters 64, 65. It is noted that the sizes of like-polarity transistors in the inverters 74, 75 are substantially the same. Similarly, the sizes of like-polarity transistors in the inverters 64, 65 are substantially the same. Preferably, the ratio of the sizes of the transistors in the inverters 74, 75 to the sizes of the transistors in the inverters 64, 65 is substantially the same as the ratio of the resistances of the resistors 62, 63 to the resistances of the resistors 72, 73. It is also understood that although inverters 64, 65 and 74, 75 are shown, other logic elements, such as NAND or NOR gates, may be used to implement more complex logic functions within the corrector 12, such as an enable, set, and reset functions.

Having described the preferred embodiment of this invention, it will now be apparent to one of skill in the art that other embodiments incorporating its concept may be used. It is felt, therefore, that this invention should not be limited to the disclosed embodiment, but rather should be limited only by the spirit and scope of the appended claims.

I claim:

1. A variable delay element with an input and an output, formed in an integrated circuit, for delaying signals, the delay varying in response to a control signal, having:
    a first capacitive means; and
    a first variable coupling means, having an output coupling to the output of the variable delay element, for variably coupling the output of the variable delay element to the first capacitive means in response to the control signal;
    wherein the delay element is characterized by: the first capacitive means having first and second capacitors and the first variable coupling means having first and second transistors of opposite conductivity types, connected between corresponding first and second capacitors and the output of the first variable coupling means;
    wherein the delay of the variable delay element is dependent on the control signal and the amount of coupling by the first variable coupling means, such that the amount of coupling varies proportionally with the desired delay of the variable delay element.

2. The variable delay element as recited in claim 1, further characterized by:
    a first inverter with first and second power terminals and an input and an output coupled to corresponding the input and output of the variable delay element; and,
    means, dependent on the control signal and coupled between a first power source and the first power terminal, to provide current to the inverter and control the delay provided thereby.

3. The variable delay element as recited in claim 2, further having:
    a second inverter with first and second power terminals coupled to corresponding first and second power terminals of the first inverter, and an input and an output coupled to an additional input and output of the variable delay element;
    a second capacitive means; and,
    a second variable coupling means having an output coupling to the output of the second inverter for variably coupling the output of the second inverter to the second capacitive means in reponse to the control signal, wherein the delay element is characterized by: the second capacitive means having first and second capacitors and the second variable coupling means having first and second transistors of opposite conductivity types, connected between corresponding first and second capacitors and the output of the second variable coupling means;

wherein the variable delay element is a differential variable delay element.

4. The variable delay element as recited in claim 3, wherein the delay element includes a second means, dependent on the control signal and coupled between a second power source and the second power terminal of the first inverter to provide current to the first and second inverters and to further control the delay provided thereby.

5. The variable delay element as recited in claim 4, the first and second variable coupling means are each characterized by: the first transistor having the conductivity thereof being dependent on the control signal and having two output terminals, the first of which is coupled to the corresponding first capacitor; and, the second transistor having the conductivity thereof being dependent on the control signal and having two output terminals, the first of which is coupled to the corresponding second capacitor;

wherein the second ones of the two output terminals from each of the first and second transistors couple together to form the output of the variable coupling means.

6. The variable delay element as recited in claim 5, further characterized by:

a bias means, responsive to the control signal, for generating the necessary signals to control the first and second transistors and the first and second variable coupling means;

wherein the first and second transistors of the first and second variable coupling means couple to, and are responsive to, the bias means.

7. The variable delay means as recited in claim 6, wherein the signals from the bias means to the first and second transistors in the first and second variable coupling means vary inversely to each other.

8. A skew corrector for substantially removing skew in differential digital signals, characterized by:

a flip-flop stage having first and second power terminals and having first and second inputs;

a driver stage having first and second power terminals and having outputs coupling to the first and second inputs of the flip-flop stage;

a first pair of resistors coupling between corresponding first and second power sources and corresponding first and second power terminals of the flip-flop stage; and, a second pair of resistors coupling between the corresponding first and second power sources and corresponding first and second power terminals of the driver stage;

wherein the resistances of the resistors of each pair are substantially the same.

9. The skew corrector recited in claim 8, wherein the flip-flop stage is characterized by:

a first inverter, having an input and an output, powered by the first and second power terminals of the flip-flop stage, and, a second inverter, having an input and an output, powered by the first and second power terminals of the flip-flop stage, wherein the first and second inverters are cross-coupled and the inputs to the first and second inverters are coupled to the first and second inputs of the flip-flop stage; and, wherein the driver stage is characterized by:

a third inverter having an input, an output and powered by first and second power terminals of the driver stage;

a fourth inverter having an input, an output and powered by the first and second power terminals of the driver stage;

wherein the outputs of the third and fourth inverters couples to the corresponding first and second inputs of the flip-flop stage.

10. The skew correcting detector recited in claim 9, wherein the inverters are each characterized by a pair of opposite polarity type transistors having common input terminals and one common output terminal being the input and output of each inverter, respectively, and each transistor coupling to the first and second power terminals, respectively.

11. The skew correcting detector recited in claim 10, further characterized by the sizes of the transistors in the first and second inverters are substantially the same and the sizes of the transistors in the third and fourth inverters are substantially the same.

12. The skew correcting detector recited in claim 11, further characterized by:

the sizes of the transistors in the first and second inverters are substantially equal to or smaller than the sizes of the transistors in the third and fourth inverters, and the resistances of the first pair of resistors being substantially equal to or larger than the resistances of the second pair of resistors;

wherein the ratio of the difference in sizes of the transistors be substantially the same as the ratio of the resistances of the resistors.

* * * * *